United States Patent [19]

Nakano et al.

[11] Patent Number: 4,716,549

[45] Date of Patent: Dec. 29, 1987

[54] SEMICONDUCTOR MEMORY DEVICE HAVING A CIRCUIT FOR COMPENSATING FOR DISCRIMINATING VOLTAGE OF MEMORY CELLS

[75] Inventors: Masao Nakano, Kawasaki; Yoshihiro Takemae, Tokyo; Tomio Nakano, Kawasaki; Shigeki Nozaki, Kuwana; Kimiaki Sato, Tokyo; Nobumi Kodama, Kawasaki, all of Japan

[73] Assignee: Fujitsu Limited, Kanagawa, Japan

[21] Appl. No.: 901,680

[22] Filed: Aug. 29, 1986

[30] Foreign Application Priority Data

Oct. 8, 1985 [JP] Japan .................. 60-222757

[51] Int. Cl.$^4$ .................. G11C 7/02; G11C 11/24
[52] U.S. Cl. .................. 365/203; 365/149
[58] Field of Search .................. 365/149, 190, 203, 205

[56] References Cited

U.S. PATENT DOCUMENTS

| | | | |
|---|---|---|---|
| 3,946,368 | 3/1976 | Chou | 365/190 |
| 4,195,239 | 3/1980 | Suzuki | 365/205 |
| 4,259,729 | 3/1981 | Tokushige | 365/149 |

Primary Examiner—James W. Moffitt
Attorney, Agent, or Firm—Armstrong, Nikaido, Marmelstein & Kubovcik

[57] ABSTRACT

A semiconductor memory device capable of compensating for variation in a discriminating voltage of a memory cell comprising a memory cell and a gate circuit for coupling the memory cell to a bit line. The device has a precharge circuit for precharging the bit line pair to a predetermined resultant precharge voltage in a reset state. The precharge circuit precharges a bit line pair with the resultant precharge voltage obtained by adding a compensating voltage to a precharge voltage in the reset state. The compensating voltage is adapted to compensate for variation in a memory cell discriminating voltage based on variation in a memory cell voltage caused by capacitive coupling of a word line to a memory capacitor due to a parasitic capacitance of a gate circuit in the active state, and the precharge voltage is adapted to optimize the memory cell discriminating voltage when it is assumed that the parasitic capacitance is not present.

7 Claims, 6 Drawing Figures

SEMICONDUCTOR MEMORY DEVICE HAVING A CIRCUIT FOR COMPENSATING FOR DISCRIMINATING VOLTAGE OF MEMORY CELLS

BACKGROUND OF THE INVENTION

1. Field of the Invention

The present invention relates to a dynamic semiconductor memory device having a circuit for compensating for variations in a discriminating voltage of a memory cell caused by a parasitic capacitance of a gate transistor of the memory cell upon activation thereof.

2. Description of the Related Art

In a so-called dynamic semiconductor memory device having memory cells consisting of a capacitor and a gate transistor, the memory capacitor of each memory cell is connected to a bit line through the gate transistor, and a charging stage of the capacitor is detected by a sense amplifier connected to the bit line to discriminate logic "0" or "1" of the memory cell. The ON/OFF operation of the gate transistor is performed via a word line. In this case, the word line may be capacitively coupled to the memory capacitor because of the parasitic capacitance of the gate transistor. If a word line voltage rises to enable the memory cell, the memory cell voltage is influenced by noise through the aforementioned parasitic capacitance and undesirably varies. As a result, the memory cell discriminating voltage i.e., threshold voltage for discriminating the logic "0" or "1" of the memory cell content, is deviated from an accurate intermediate value between logic "0" and logic "1" voltages. The margin for noise is reduced and a read error of the memory cell tends to occur.

In order to solve this problem, in a conventional dynamic semiconductor memory device, a dummy transistor is formed in each memory cell to cancel the parasitic capacitance of the gate transistor by its own parasitic capacitance, hereby variations in discriminating voltage are prevented. However, if the dummy transistors are arranged in units of memory cells, the total number of dummy transistors is increased, and a large area is occupied by the dummy transistors in the memory device as a whole. As a result, the memory capacity of the semiconductor memory device per unit area is reduced.

SUMMARY OF THE INVENTION

It is, therefore, an object of the present invention to provide a semiconductor memory device having a compensating circuit for compensating for variations in a discriminating voltage of a memory cell caused by noise generated upon activation of a memory cell via a word line, without using a dummy transistor.

In accordance with the present invention, there is provided a semiconductor memory device having a circuit for compensating for a discriminating voltage of a memory cell, comprising: a bit line pair consisting of first and second bit lines; a memory cell comprising a memory capacitor for storing data and a gate circuit capable of coupling the memory capacitor to the first bit line of the bit line pair; a word line, connected to the gate circuit, for energizing and deenergizing the gate circuit to control coupling and decoupling of the memory cell to and from the first bit line; a sense amplifier connected to said bit line pair, which sense amplifier being adapted to sense and amplify a voltage at the first bit line by using a precharge voltage of the second bit line as a reference voltage in an active stage of the semiconductor memory device; and a precharge circuit for precharging the bit line pair to a predetermined resultant precharge voltage in a reset state of the semiconductor memory device. The precharge circuit precharges the bit line pair with a resultant precharge voltage obtained by adding a compensating voltage to a precharge voltage in the reset state. The compensating voltage is adapted to compensate for variation in a memory cell discriminating voltage based on a variation in a memory cell voltage caused by capacitive coupling of the word line to the memory capacitor due to a parasitic capacitance of the gate circuit in the active state. The precharge voltage is adapted to optimize the memory cell discriminating voltage when it is assumed that the parasitic capacitance is not present.

BRIEF DESCRIPTION OF THE DRAWINGS

Embodiments of the semiconductor memory device according to the present invention will now be described in detail with reference to the accompanying drawings, in which.

DESCRIPTION OF THE PREFERRED EMBODIMENTS

For easy and better understanding of the preferred embodiment, the problems in the prior art will first be explained in detail with reference to FIGS. 1 and 2.

Figure 1:
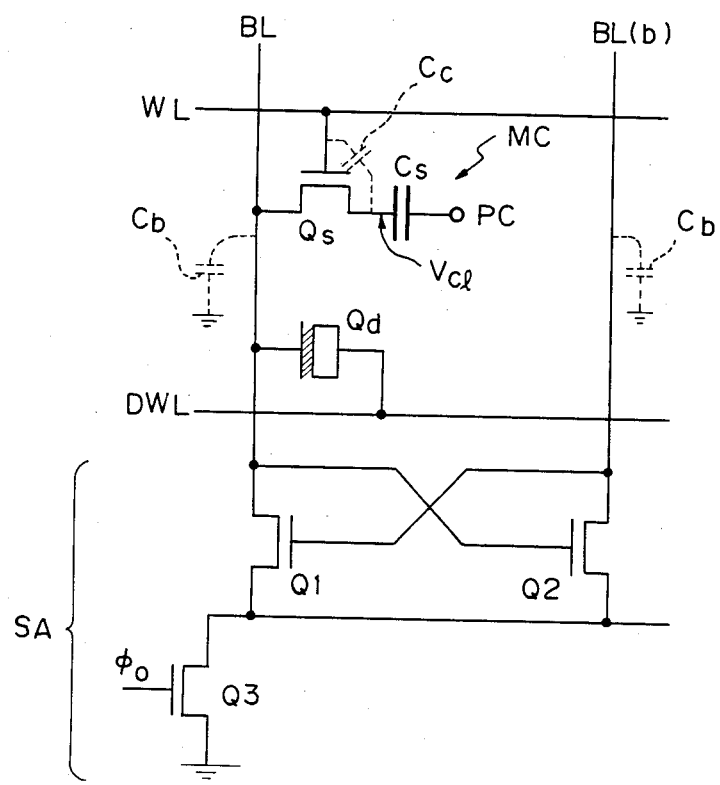
FIG. 1 is a circuit diagram of a conventional memory device.

FIG. 1 is a circuit diagram showing conventional semiconductor memory device. Referring to FIG. 1, reference symbols BL and BL(b) denote bit lines; WL, a real word line; MC, a real memory cell; SA, a sense amplifier; Qd, a dummy transistor; and DWL, a dummy word line. The memory cell MC comprises a cell capacitor Cs for storing data and a gate transistor Qs for coupling the cell capacitor Cs to the bit line BL. Reference symbol PC denotes a cell plate of the cell capacitor Cs, which generates a constant voltage (Vcc/2). The sense amplifier SA is a known circuit consisting of transistors Q1, Q2, and Q3.

Reference symbol Cc denotes a parasitic capacitance existing between the node and the corresponding word line in the memory cell so as to capacitively couple the node to the word line; and Cb, parasitic capacitances of the bit lines BL and BL(b).

In the memory device of FIG. 1, the charged and discharged states of the capacitor Cs in the memory cell MC correspond to logic "1" and logic "0", respectively. If the memory cell is set at logic "1", a memory cell voltage Vcl is set to be a power source voltage Vcc.

However, if the memory cell is set at logic "0", the memory cell voltage Vcl is set to be zero volt. The charging state of the cell capacitor Cs is detected by the sense amplifier SA, thereby reading out data from the memory cell.

The above operation will be described in more detail below. When the memory device is reset, the bit lines BL and BL(b) are precharged at a voltage of Vcc/2, i.e., the accurately intermediate value between the logic "1" and "0" voltages. In the active mode wherein data is read out from the memory cell MC, a clock $\phi_o$ is supplied to the sense amplifier SA so that the sense amplifier SA is enabled. At the same time, the voltage at the word line WL rises to turn on the gate transistor Qs so that the cell capacitor Cs is connected to the bit line BL. The voltage at the bit line BL is slightly charged up or down with respect to Vcc/2 according to whether the cell capacitor Cs is charged or discharged. The change is detected and amplified by the sense amplifier SA, thereby reading out data from the memory cell.

The sense amplifier SA uses the precharge voltage of Vcc/2 of the bit line BL(b) as a reference voltage Vrf and detects the change in voltage at the bit line BL. More specifically, if the memory cell MC is set at logic "1", the cell capacitor Cs is discharged to apply a discharge voltage to the bit line BL. In this case, the voltage at the bit line BL is slightly increased from Vcc/2. However, if the memory cell MC is set at logic "0", a charge is supplied from the bit line BL to the cell capacitor Cs so that a voltage at the bit line BL is slightly reduced. This change is detected by the sense amplifier SA using the reference voltage Vrf of Vcc/2.

The relationship between the memory cell voltage Vcl of the memory cell MC when the data is stored and an output signal magnitude $\Delta V$ (i.e., a change in voltage at the bit line BL) of the memory cell MC when the data is red out will be described hereinafter. First, assuming that the memory cell MC does not have the parasitic capacitance Cc, the above relationship will be described.

The output signal magnitude $\Delta V$ of the memory cell MC is calculated by equation (1) based on the rule of charge conservation indicating the fact that the charge before read access of the memory cell MC is equal to that after read access thereof:

$$(Vcl - Vpc)Cs + Vb \cdot Cb = (Vb + \Delta V)Cb + (Vb + \Delta V - Vpc)Cs \quad (1)$$

for Vb=Vcc/2 and Vpc=Vcc/2
where
Cs: the capacitance of the memory capacitor Cs
Cb: the capacitance of the bit lines BL and BL(b)
Vcl: the memory cell voltage
Vb: the precharge voltage on the bit lines BL and BL(b)
Vpc: the cell plate voltage
Vcc: the power source voltage Substitution of Vb=Vpc=Vcc/2 into equation (1) yields the following equation:

$$\Delta V = \frac{Vcl - Vcc/2}{(Cb/Cs) + 1} \quad (2)$$

Figure 2:
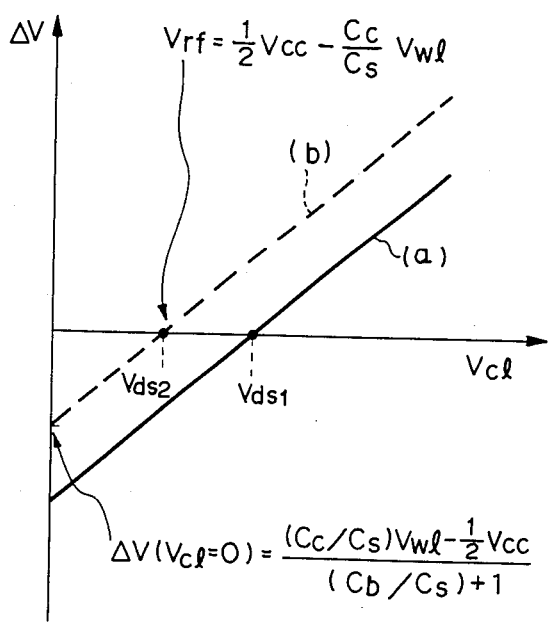
FIG. 2 is a graph showing the relationship between a memory cell voltage and a signal level in the device of FIG. 1.

FIG. 2 is a graph showing the characteristics of equation (2) when the precharge voltage $V_b$ (i.e., the reference voltage for causing the sense amplifier SA to discriminate the logic "0" of the memory cell from the logic "1") on the bit lines BL and BL(b) is set to be Vcc/2. In the graph, the memory cell voltage Vcl is plotted along the abscissa, and the signal magnitude $\Delta V$ is plotted along the ordinate. A solid characteristic curve (a) represents the characteristics of equation (2). That is, a straight line with the following slope, x-intercept, and y-intercept is obtained:

Slope:

$$m = \frac{1}{(Cb/Cs) + 1} \quad (3)$$

The y-intercept is a value of $\Delta V$ when the memory cell voltage Vcl is 0, that is, Y-intercept:

$$\Delta V(Vcl = 0) = -\frac{Vcc/2}{(Cb/Cs) + 1} \quad (4)$$

The x-intercept is a value of the memory cell voltage Vcl when the signal magnitude $\Delta V$ is zero, that is,
X-intercept:

$$Vdsl = Vcl(\Delta V = 0) = Vcc/2 \quad (5)$$

The x-intercept of the $\Delta V$ characteristic curve is the memory cell voltage Vcl as a threshold voltage for discriminating whether the content of the memory cell MC is logic "0" or "1" and is referred to as a discriminating voltage Vds of the memory cell MC. The voltage Vcc/2 as a half of a difference (normally Vcc) between the logic "0" and "1" voltages of the memory cell MC is used as the discriminating voltage Vds. If a memory cell voltage Vcl is higher than the discriminating voltage Vds, the corresponding cell is discriminated by the sense amplifier SA to be logic "1". Otherwise, the memory cell is discriminated to be logic "0", if the memory cell voltage Vcl is lower than the Vds. In this way, a maximum noise margin can be provided to reduce read errors of the memory cell MC.

On the other hand, the parasitic capacitance Cc for capacitively coupling the memory capacitor Cs and the word line WL is present in the memory cell. Therefore, in practice, the characteristic curve of the signal magnitude $\Delta V$ is changed as follows.

If a potential at the word line WL rises to read out the content of the memory cell, it is transmitted to the memory capacitor Cs through the parasitic capacitance Cc, whereby the memory cell voltage Vcl rises. Assuming that the voltage at the word line WL is increased from 0 V to Vwl, an increase in memory cell voltage Vcl is given as follows:

$$\text{Increase in } Vcl = (Cc/Cs)Vwl \quad (6)$$

Therefore, an output signal magnitude $\Delta V$ appearing at the bit line BL under the presence of the coupling parasitic capacitance Cc is given by:

$$\Delta V = \frac{Vcl + (Cc/Cs)Vwl - Vcc/2}{(Cb/Cs) + 1} \quad (7)$$

since the memory cell voltage in the read mode is given as:

$$Vcl + (Cc/Cs)Vwl$$

Equation (7) is represented by a broken characteristic curve (b) in FIG. 2 i.e., a straight line with the following slope, and x- and y-intercepts:
Y-intercept:

$$\Delta V(Vcl = 0) = \frac{(Cc/Cs)Vwl - Vcc/2}{(Cb/Cs) + 1} \quad (8)$$

X-intercept:

$$Vds2 = Vcc/2 - (Cc/Cs)Vwl \quad (9)$$

Slope:

$$m = \frac{1}{(Cb/Cs) + 1} \quad (10)$$

The line (b) is obtained by simply parallel displacing the line (a).

As is apparent from the characteristic curve (b) in FIG. 2, the discriminating voltage Vds of the memory cell MC is represented by equation (9) when the parasitic capacitance Cc is present. This discriminating voltage is lower by $Cc \cdot Vwl/Cs$ than the discriminating voltage Vdsl=Vcc/2 given no parasitic capacitance Cc. More specifically, since the memory cell voltage Vcl is increased, the discriminating voltage Vds is comparatively lower than the intermediate level to be biased. As a result, the operation margin is reduced and thus read errors tend to occur.

In order to solve this problem, the dummy cell Qd is connected to the bit line BL to which the memory cell MC is connected, as shown in FIG. 1. When the word line WL is enabled, a voltage having a polarity opposite to that of the enabling voltage of the word line WL is applied to the dummy cell Qd through the dummy word line DWL, whereby the potential at the bit line BL is decreased by an increase caused by the parasitic capacitance Cc of the bit line BL, thereby cancelling the influence of the parasitic capacitance Cc.

Since the dummy transistor Qd, however, must be arranged in units of memory cells, the total number of dummy transistors in the semiconductor memory device is increased and utilization efficiency of the area of the semiconductor memory cell as a whole is degraded.

A preferred embodiment of the present invention will now be explained with reference to FIGS. 3 through 5. The same reference numerals as in FIG. 1 denote the same parts in FIG. 3. Reference symbol Cps denotes a capacitor for supplying a compensating voltage to bit lines BL and BL(b); Q4, a gate transistor for charging the capacitor Cps in the active state; Q5 and Q6, gate transistors for shunting between the bit lines BL and BL(b) in the reset mode; and Q7, a gate transistor for supplying a charge of the capacitor Cps to the bit lines BL and BL(b) in the reset mode. Resistors R1 and R2 serve as voltage dividers for supplying a very small current to the bit lines so as to prevent the precharge voltage on the bit lines BL and BL(b) from being decreased when the semiconductor memory device is reset for a long period of time, thereby maintaining the bit lines at a predetermined potential (Vcc/2+α). The resistors R1 and R2 comprise high-impedance resistors.

For better understanding of the preferred embodiment, the principle of operation of the present invention will be described with reference to FIG. 4.

Figure 4:
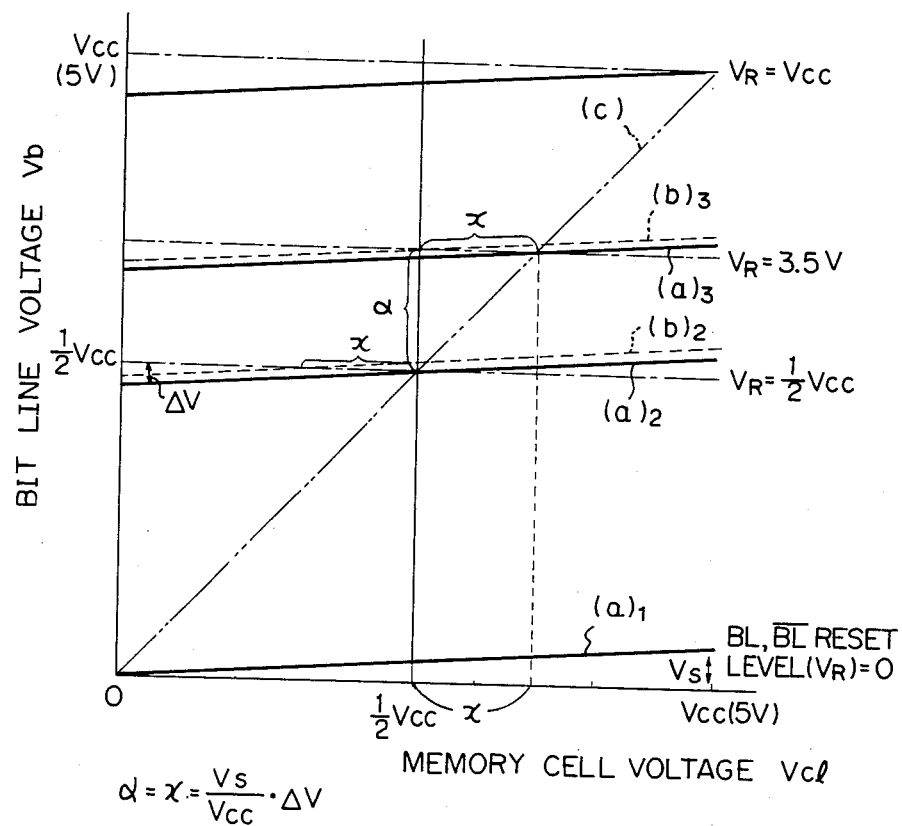
FIG. 4 is a graph showing the relationship between a cell voltage Vcl of a memory cell and output signal magnitudes $\Delta V$ of the memory cell as a function of the cell voltage Vcl.

FIG. 4 is a graph wherein the memory cell voltage Vcl of the memory cell MC is plotted along the abscissa and a precharged bit line voltage Vb is plotted along the ordinate. The characteristic curves in FIG. 4 represent the memory cell output signal magnitudes ΔV as a function of the memory cell voltages Vcl of the memory cell MC when the precharge voltage on the bit lines BL and BL(b) is set at 0, Vcc/2, and Vcc/2+α. Solid lines (a)₁, (a)₂, and (a)₃ are memory cell signal magnitudes ΔV when the bit line precharge voltage Vb is set at 0, Vcc/2, and Vcc2+α under the condition that the parasitic capacitance Cc is not present. On the other hand, broken lines (b)₂ and (b)₃ are memory cell signal magnitudes ΔV when the bit line precharge voltage Vb is set at Vcc/2 and Vcc/2+α under the condition that the parasitic capacitance Cc is actually present. A characteristic curve (c) is plotted along bit line voltage points where the signal magnitude ΔV becomes 0 for the memory cell voltage Vc, and is represented by a straight line with a slope m of 1.

Assuming the characteristic curves (a)₂ and (b)₂, they have the same characteristics as obtained in FIG. 2. Accordingly, although the discriminating voltage Vds is Vcc/2 when the parasitic capacitance Cc is not present, the voltage Vds is lower by x=(Cc/Cs)Vwl from Vcc/2 when the parasitic capacitance Cc is present. This implies the following fact. In order to set the discriminating voltage Vds to be Vcc/2 as an intermediate value between the logic "0" and "1" voltages when the parasitic capacitance Cc is present, the discriminating voltage Vds obtained without the parasitic capacitance Cc is set to be Vcc/2+x. Then, if the parasitic capacitance Cc is present, the discriminating voltage Vds is lowered by x, i.e., is set to be Vcc/2. The value of the bit line precharge voltage Vb for setting the discriminating voltage Vds obtained without the parasitic capacitance Cc to be Vcc/2+x is the value of the bit line precharge voltage Vb corresponding to the memory cell voltage Vcl=Vcc/2+x in the characteristic curve (c). As a result, since the slope of the line (c) is 1 so that x=α, the bit line voltage Vb should be set to be $$Vcc/2 + \alpha = \frac{Vcc}{2} + \frac{Cc}{Cs}.$$

If the parasitic capacitance Cc is present, the output signal magnitude ΔV is obtained according to the characteristic curve (b)₃. In this case, the discriminating voltage Vds of the memory cell MC is properly maintained at Vcc/2, thereby obtaining a maximum operating margin.

According to the present invention, the reference voltage Vrf for discrimination by the sense amplifier is increased or decreased from the normal value (Vcc/2) by a value for compensating a variation α as an increase or decrease in memory cell voltage Vcl caused by the influence of the parasitic capacitance Cc upon activation of the bit and word lines. Therefore, the discriminating voltage Vds can be maintained at an optimal value.

Referring back to FIG. 3, the operation of the circuit will be described. If the bit lines BL and BL(b) are active, one is set at logic "1" (Vcc), and the other is set at logic "0" (0 V). The capacitances Cb of the bit lines BL and BL(b) with respect to the ground are the same. In the reset mode wherein the data is not read out from the memory device, if the gate transistors Q5 and Q6 are turned on to short-circuit the bit lines BL and BL(b), the bit lines BL and BL(b) are precharged at Vcc/2. Upon the ON operation of the gate transistor Q7 in the reset mode, the capacitor Cps having charged by rising the active clock $\phi_a$ in the active state of the memory device is discharged to the bit lines BL and BL(b), whereby the precharge voltages of the bit lines can be set Vcc/2+$\alpha$ higher than Vcc/2.

An increment $\alpha$ can be adjusted by the capacitance of the capacitor Cps. The value of the capacitor Cps for setting the voltage increment to be $\alpha$ is given by the following equation according to the rule of charge conservation:

$$2(Cb \cdot Vcc/2) + Vcc \cdot Cps = (Vcc/2 + \alpha) \cdot (2Cb + Cps) \tag{11}$$

The capacitor Cps comprises a MOS capacitor so that all capacitors for all bits can be simultaneously formed. The occupying area of the MOS capacitors is smaller than that of the dummy cells described with reference to FIG. 1, and the MOS capacitors pose little fabrication problems.

Figure 5:
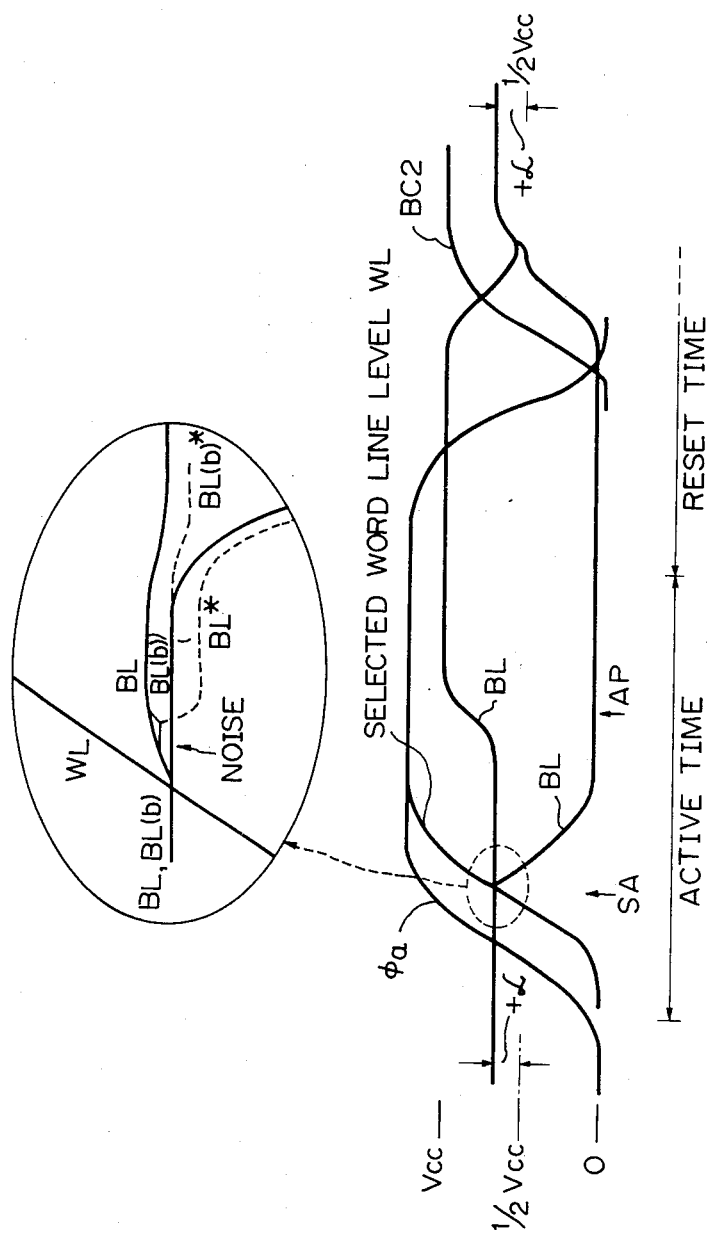
FIG. 5 is a time chart for explaining the operation of the device in FIG. 4.

FIG. 5 is a time chart for explaining the operation of the embodiment (FIG. 3) of the present invention. The same reference numerals as in FIG. 3 denote the same parts in FIG. 5. Referring to FIG. 5, reference symbol SA denotes a timing at which the sense amplifier SA is activated; and AP, an active pull-up timing. In FIG. 5, waveforms at the timing SA are denoted by an enlarged view, wherein BL and BL(b) are waveforms when the cell voltage is high and BL* and BL(b)* when the cell voltage is low.

As is apparent from FIG. 5, an active clock signal $\phi_a$ is enabled in the active period to charge up the capacitor Cps to Vcc and is disabled in the reset time.

After the active clock signal $\phi_a$ is enabled, a clock signal BC2 is enabled to shunt the bit lines so that the bit lines BL and BL(b) and the capacitor Cps are shunted to precharge the bit lines to Vcc/2+$\alpha$.

Figure 3:
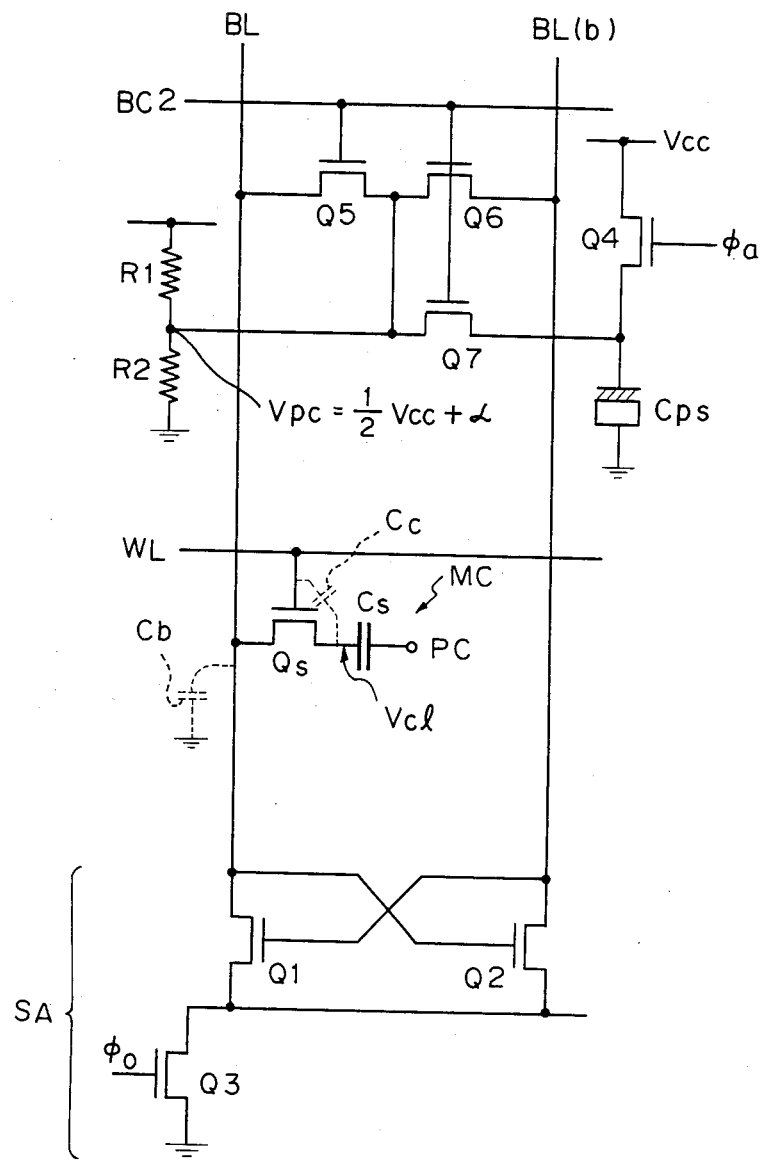
FIG. 3 is a circuit diagram of a semiconductor memory device according to an embodiment of the present invention.

As described before, the cell plate voltage Vps at the common junction between the resistors R1 and R2 in FIG. 3 is used to set the bit lines BL and BL(b) to the voltage Vcc/2+$\alpha$ obtained by voltage division by means of the resistors when the reset time is prolonged.

Although a preferred embodiment has been described hereinbefore, various modifications and alterations are possible within the scope of the present invention.

The above embodiment is described with reference to a case wherein the bit line voltage is increased by the influence of the parasitic capacitance Cc at the data read mode. However, a bit line voltage may be decreased. In this case, the memory cell discriminating voltage must also be maintained at about Vcc/2. The main part of another embodiment for this purpose will be described in FIG. 6. The same reference numerals as in FIG. 3 denote the same parts in FIG. 6.

Figure 6:
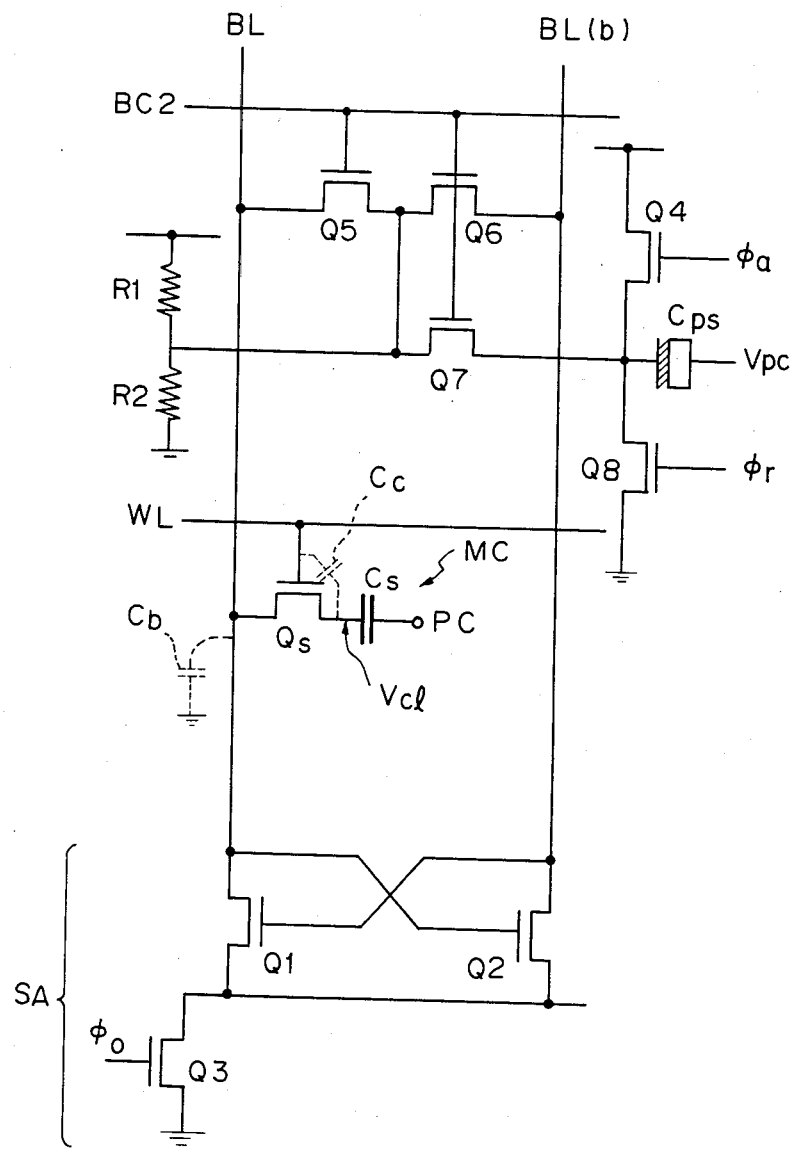
FIG. 6 is a circuit diagram of a semiconductor memory device according to another embodiment of the present invention.

Referring to FIG. 6, reference symbol Q8 denotes a transistor; and $\phi_r$, a reset clock signal.

In the embodiment described with reference to FIG. 3, the reference voltage Vrf is increased to compensate the discriminating voltage Vds decreased by coupling between the work line WL and the node of the memory cell. On the contrary, the circuit of FIG. 6 corrects an increase in discriminating voltage. In the circuit of FIG. 6, the active clock signal $\phi_a$ and the charge reset signal $\phi_r$ of the capacitor which has the opposite phase as that of the clock signal $\phi_a$ are enabled to turn on the transistor Q8 so as to discharge the capacitor Cps during the active period. The charge of the capacitor Cps is extracted from the bit lines BL and BL(b) to decrease the reference voltage Vrf. Note that when the transistor Q8 is turned on, the transistor Q4 is turned off. In addition, if one of the electrodes of the capacitor Cps is commonly used as the cell plate of the memory capacitor, a thin-film memory cell can be prepared.

The reset clock signal $\phi_r$ in FIG. 6 resets the charged capacitor Cps. The reset clock signal $\phi_r$ is enabled at the same timing as that of the active clock signal $\phi_a$ and disabled at the reset timing. In this case, the active clock signal $\phi_a$ is set at low level, and the transistor Q8 is kept off.

In the two embodiments described above, the bit line precharge voltage is derived from the cell plate voltage Vpc. However, the bit line precharge voltage may be provided separately from the cell plate voltage Vpc. The cell plate voltage Vpc is preferably set to be about Vcc/2 to reduce a maximum electric field applied to the dielectric members of the capacitor and is not limited to Vcc/2.

We claim:

1. A semiconductor memory device having a circuit for compensating for a discriminating voltage of a memory cell, comprising:
    a bit line pair consisting of first and second bit lines;
    a memory cell comprising a memory capacitor for storing data and a gate circuit capable of coupling the memory capacitor to the first bit line of the bit line pair;
    a word line, connected to the gate circuit, for energizing and deenergizing the gate circuit to control coupling and decoupling of the memory cell to and from the first bit line;
    a sense amplifier connected to the bit line pair, which sense amplifier being adapted to sense and amplify a voltage at the first bit line by using a precharge voltage of the second bit line as a reference voltage in an active state of the semiconductor memory device; and
    a precharge circuit for precharging the bit line pair to a predetermined resultant precharge voltage in a reset state of the semiconductor memory device,
    wherein the precharge circuit precharges the bit line pair with the resultant precharge voltage obtained by adding a compensating voltage to a precharge voltage in the reset state, the compensating voltage being adapted to compensate for variation in a memory cell discriminating voltage based on variation in a memory cell voltage caused by capacitive coupling of the word line to the memory capacitor due to a parasitic capacitance of the gate circuit in the active state, and the precharge voltage being adapted to optimize the memory cell discriminating voltage when it is assumed that the parasitic capacitance is not present.

2. A semiconductor memory device according to claim 1, wherein the precharge circuit comprises:
    a second gate circuit for short-circuiting between the first and second bit lines in the reset state to supply to the bit line pair the precharge voltage for optimizing the memory cell discriminating voltage when it is assumed that the parasitic capacitance is not present; and
    a compensating circuit for adding, to the precharge voltage obtained by the second gate circuit, the compensating voltage.

3. A semiconductor memory device according to claim 2, wherein the compensating circuit comprises:
    a compensating capacitor for storing a charge corresponding to the variation in the compensating voltage for compensating the memory cell discriminating voltage based on the variation in the memory cell voltage caused by the capacitive coupling of the word line to the memory capacitor due to the parasitic capacitance of the gate circuit upon activation of the memory cell by means of the word line;

a second gate circuit for supplying the charge corresponding to the compensating voltage to the compensating capacitor in the active state; and a third gate circuit for supplying the charge corresponding to the compensating voltage from the compensating capacitor to the bit line pair in the reset state, thereby compensating for variation in the memory cell discriminating voltage based on the parasitic capacitance and thereby optimizing the discriminating voltage.

4. A semiconductor memory device according to claim 3, wherein the compensating circuit is constituted to be capable of compensating for a decrease in the memory cell discriminating voltage based on the parasitic capacitance.

5. A semiconductor memory device according to claim 3, wherein the compensating circuit is constituted to be capable of compensating for an increase in the memory cell discriminating voltage based on the parasitic capacitance.

6. A semiconductor memory device according to claim 3, wherein the compensating circuit further comprises a fourth gate circuit for charging the compensating capacitor in the active state, which is alternatively operated with the second gate circuit, the compensating circuit being capable of compensating for both a decrease and increase in the memory cell discriminating voltage based on the parasitic capacitance.

7. A semiconductor memory device according to any one of claims 1 to 6, wherein the precharge circuit further comprises a high-impedance resistance voltage divider for supplying the resultant precharge voltage to the bit line pair in the reset state for a provision of a long period of reset time.

* * * * *